United States Patent
Yu et al.

(10) Patent No.: US 10,833,039 B2
(45) Date of Patent: Nov. 10, 2020

(54) MULTI-CHIP FAN OUT PACKAGE AND METHODS OF FORMING THE SAME

(71) Applicant: Taiwan Semiconductor Manufacturing Company, Ltd., Hsinchu (TW)

(72) Inventors: Chen-Hua Yu, Hsinchu (TW); Jing-Cheng Lin, Hsinchu (TW); Jui-Pin Hung, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 16/209,454

(22) Filed: Dec. 4, 2018

(65) Prior Publication Data

US 2019/0109118 A1    Apr. 11, 2019

Related U.S. Application Data

(60) Continuation of application No. 15/632,774, filed on Jun. 26, 2017, now Pat. No. 10,163,857, which is a
(Continued)

(51) Int. Cl.
*H01L 21/56* (2006.01)
*H01L 23/00* (2006.01)
(Continued)

(52) U.S. Cl.
CPC ........ *H01L 24/19* (2013.01); *H01L 21/31053* (2013.01); *H01L 21/561* (2013.01); *H01L 21/565* (2013.01); *H01L 21/568* (2013.01); *H01L 21/6836* (2013.01); *H01L 23/3128* (2013.01); *H01L 23/5386* (2013.01); *H01L 23/5389* (2013.01); *H01L 24/03* (2013.01); *H01L 24/05* (2013.01); *H01L 24/11* (2013.01); *H01L 24/13* (2013.01); *H01L 24/20* (2013.01); *H01L 24/24* (2013.01); *H01L 24/82* (2013.01); *H01L 24/92* (2013.01); *H01L 24/94* (2013.01); *H01L 24/96* (2013.01); *H01L 25/0655* (2013.01); *H01L 25/50* (2013.01); *H01L 21/78* (2013.01); *H01L 23/49816* (2013.01); *H01L 23/544* (2013.01); *H01L 24/742* (2013.01);
(Continued)

(58) Field of Classification Search
CPC ......... H01L 24/19; H01L 24/97; H01L 24/13; H01L 23/3128; H01L 23/5389
See application file for complete search history.

(56) References Cited

U.S. PATENT DOCUMENTS 5,557,054 A  9/1996  Shigenaga
6,244,499 B1 6/2001  Tsai et al.
(Continued)

FOREIGN PATENT DOCUMENTS

CN    1759480 A    4/2006
CN    101621041    1/2010

*Primary Examiner* — Zandra V Smith
*Assistant Examiner* — Abbigale A Boyle
(74) *Attorney, Agent, or Firm* — Slater Matsil, LLP

(57) ABSTRACT

A package includes a die having a conductive pad at a top surface of the die, a stud bump over and connected to the conductive pad, and a redistribution line over and connected to the stud bump. An electrical connector is over and electrically coupled to the redistribution line.

20 Claims, 11 Drawing Sheets

Related U.S. Application Data division of application No. 13/452,140, filed on Apr. 20, 2012, now Pat. No. 9,691,706.

(60) Provisional application No. 61/589,586, filed on Jan. 23, 2012.

(51) Int. Cl.

| | | |
|---|---|---|
| *H01L 23/538* | (2006.01) | |
| *H01L 21/683* | (2006.01) | |
| *H01L 23/31* | (2006.01) | |
| *H01L 21/3105* | (2006.01) | |
| *H01L 25/065* | (2006.01) | |
| *H01L 25/00* | (2006.01) | |
| *H01L 23/498* | (2006.01) | |
| *H01L 23/544* | (2006.01) | |
| *H01L 21/78* | (2006.01) | |

(52) U.S. Cl.
CPC ........... *H01L 2221/68327* (2013.01); *H01L 2221/68331* (2013.01); *H01L 2223/54426* (2013.01); *H01L 2224/02311* (2013.01); *H01L 2224/0401* (2013.01); *H01L 2224/05124* (2013.01); *H01L 2224/05144* (2013.01); *H01L 2224/05147* (2013.01); *H01L 2224/05155* (2013.01); *H01L 2224/11002* (2013.01); *H01L 2224/1134* (2013.01); *H01L 2224/1184* (2013.01); *H01L 2224/11334* (2013.01); *H01L 2224/12105* (2013.01); *H01L 2224/131* (2013.01); *H01L 2224/13022* (2013.01); *H01L 2224/13023* (2013.01); *H01L 2224/13024* (2013.01); *H01L 2224/13144* (2013.01); *H01L 2224/13147* (2013.01); *H01L 2224/19* (2013.01); *H01L 2224/211* (2013.01); *H01L 2224/2101* (2013.01); *H01L 2224/214* (2013.01); *H01L 2224/215* (2013.01); *H01L 2224/244* (2013.01); *H01L 2224/24011* (2013.01); *H01L 2224/24101* (2013.01); *H01L 2224/24137* (2013.01); *H01L 2224/24991* (2013.01); *H01L 2224/82* (2013.01); *H01L 2224/82005* (2013.01); *H01L 2224/8213* (2013.01); *H01L 2224/82106* (2013.01); *H01L 2224/82132* (2013.01); *H01L 2224/92* (2013.01); *H01L 2224/9205* (2013.01); *H01L 2224/94* (2013.01); *H01L 2924/181* (2013.01); *H01L 2924/18162* (2013.01)

(56) References Cited

U.S. PATENT DOCUMENTS

| | | |
|---|---|---|
| 7,808,095 B2 | 10/2010 | Jung |
| 7,952,185 B2 | 5/2011 | Theuss et al. |
| 2004/0014317 A1 | 1/2004 | Sakamoto et al. |
| 2004/0124513 A1 | 7/2004 | Ho et al. |
| 2004/0145051 A1 | 7/2004 | Klein et al. |
| 2004/0178481 A1 | 9/2004 | Joshi et al. |
| 2004/0232543 A1 | 11/2004 | Goller et al. |
| 2005/0247944 A1 | 11/2005 | Haque et al. |
| 2006/0063312 A1 | 3/2006 | Kurita |
| 2006/0134901 A1 | 6/2006 | Chaware et al. |
| 2011/0204513 A1* | 8/2011 | Meyer .............. H01L 24/96 257/738 |
| 2012/0043655 A1 | 2/2012 | Khor et al. |
| 2013/0001776 A1 | 1/2013 | Yu et al. |

* cited by examiner ical Description of Illustrative Embodiments

MULTI-CHIP FAN OUT PACKAGE AND METHODS OF FORMING THE SAME

PRIORITY CLAIM AND CROSS-REFERENCE

This application is a continuation of U.S. patent application Ser. No. 15/632,774, entitled "Multi-Chip Fan Out Package and Methods of Forming the Same," filed on Jun. 26, 2017, which is a divisional of U.S. patent application Ser. No. 13/452,140, entitled "Multi-Chip Fan Out Package and Methods of Forming the Same," filed on Apr. 20, 2012, now U.S. Pat. No. 9,691,706 issued Jun. 27, 2017, which application claims the benefit of the following provisionally filed U.S. patent application: Application Ser. No. 61/589,586, filed Jan. 23, 2012, and entitled "Multi-Chip Fan Out process and Structure," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a great throughput and a low cost. Further, less underfill or molding compound is needed. This packaging technology, however, also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package and the methods of forming the same are provided in accordance with an embodiment. The intermediate stages of manufacturing the package in accordance with embodiments are illustrated. Variations of the embodiments are also discussed. Throughout the various views and illustrative embodiments, like reference numbers are used to designate like elements.

Figure 1:
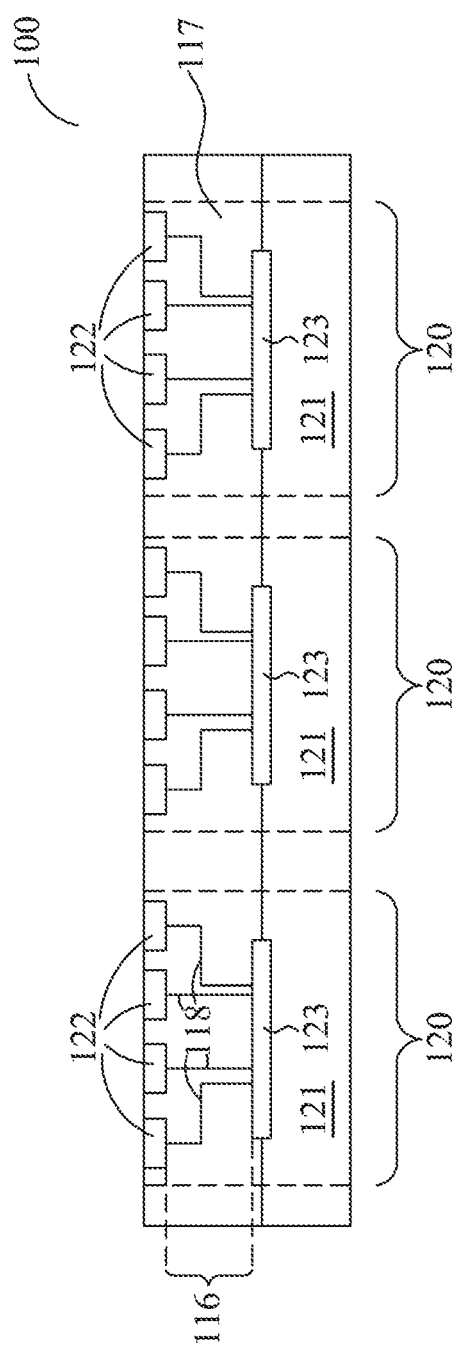
FIGS. 1 through 11 are cross-sectional views of intermediate stages in the manufacturing of a package in accordance with some exemplary embodiments.
Figure 2:
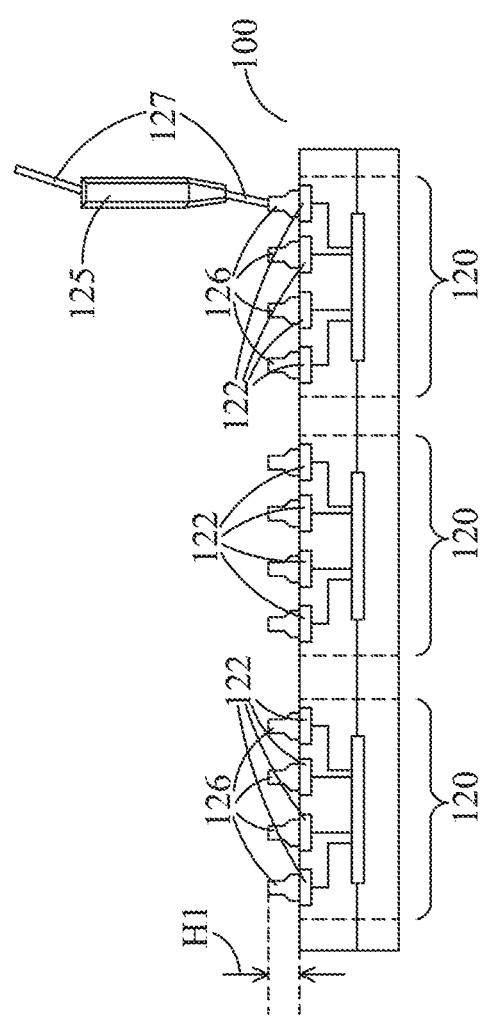
Figure 3:
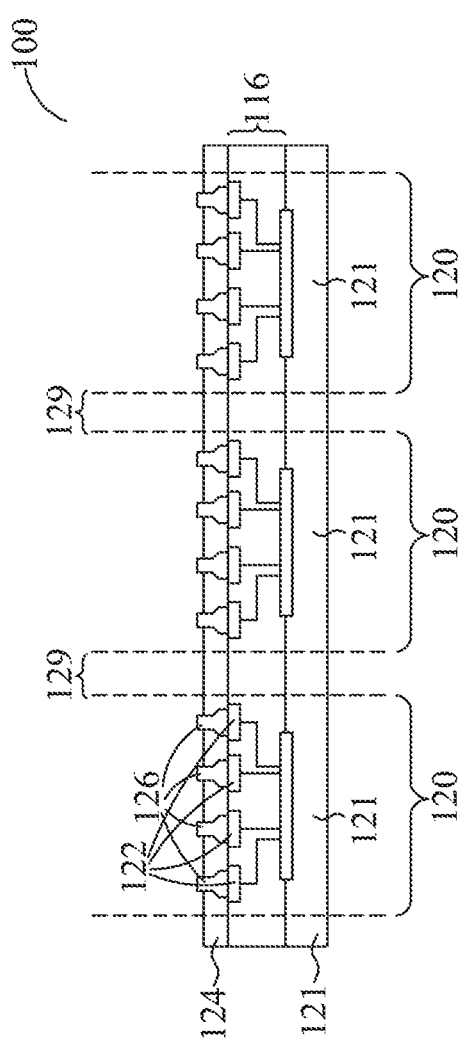

FIGS. 1 through 3 illustrate cross-sectional views in the formation of dies 120 in accordance with some exemplary embodiments. Referring to FIG. 1, wafer 100 is provided. Wafer 100 includes a plurality of chips 120 (also referred to as dies when sawed apart). Furthermore, wafer 100 (and dies 120 therein) may include semiconductor substrate 121, and may include integrated circuit devices 123 and the overlying interconnect structure 116. Integrated circuit devices 123 may include active devices such as transistors. In some exemplary embodiments, interconnect structure 116 includes metal lines and vias 118 formed in dielectric layers 117. Dielectric layers 117 may include low-k dielectric layers, for example, with k values lower than about 3.0, and passivation layers over the low-k dielectric layers. Conductive pads 122 are formed at the top surface of dies 120, and are electrically coupled to integrated circuit devices 123 through interconnect structure 116. In some embodiments, conductive pads 122 are bond pads. Conductive pads 122 may comprise metals such as aluminum, copper, nickel, gold, and combinations thereof. Alignment marks (not shown) may be formed adjacent to the top surface of dies 120, and are visible from top.

Referring to FIG. 2, in accordance with some embodiments, stud bumps 126 are formed on conductive pads 122, for example, using a wire bonding method. For example, metal wire 127 is bonded on conductive pads 122 by bond head 125 to form stud bumps 126. Stud bumps 126, due to the wire bonding process, have non-flat top surfaces, and non-vertical sidewalls. The metal wire 127 used for forming stud bumps 126 is broken, for example, by applying a force to pull wire 127 away from the respective stud bumps 126 after their formation. Accordingly, in accordance with some embodiments, substantially no wire 127 is left connected to the respective stud bumps 126, although short wires 127 may be left on stud bumps 126. Stud bumps 126 may comprise copper, gold, or the like, although other metals may be used or added. Height H1 of stud bumps 126 may be between about 10 μm and about 50 μm, for example. To increase height H1 without causing the lateral size of stud bumps 126 to increase, each of stud bumps 126 may include one or more than one stud bump stacked together.

Referring to FIG. 3, dielectric layer 124 is formed to fill into the space between stud bumps 126. The material of dielectric layer 24 may be selected from solder resists, a polymer such as polyimide, polybenzoxazole (PBO), benzocyclobutene (BCB), molding compound, and the like. The material of dielectric layer 124 may be soft for absorbing the stress applied on stud bumps 126. Stud bumps 126 may have their top surfaces level with the top surface of dielectric layer 124. Alternatively, stud bumps 126 may protrude out of dielectric layer 124. In yet other embodiments, stud bumps 126 may be embedded in dielectric layer 124.

After the curing of dielectric layer 124, wafer 100 is sawed along scribe lines 129, so that dies 120 are separated from each other. As a result of the sawing, in each of the resulting dies 120, the edges of dielectric layer 124 are aligned to the respective edges of the respective semiconductor substrate 121.

Figure 4:
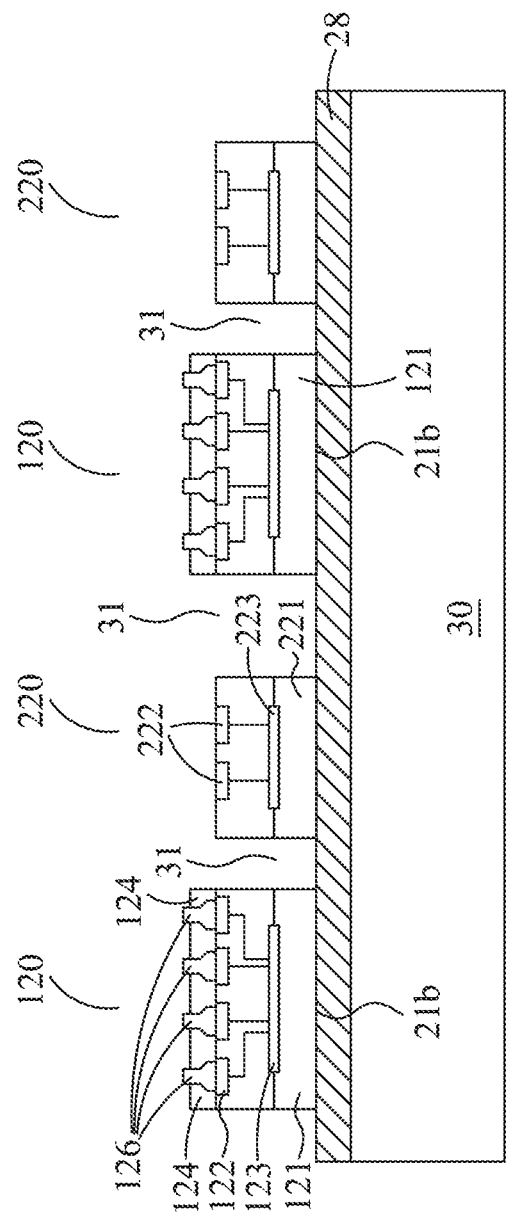

Referring to FIG. 4, adhesive layer 28 is disposed, for example, laminated, on carrier 30. Adhesive layer 28 may be formed of a glue, or may be a lamination layer formed of a foil. Dies 120 are then placed on carrier 30 and adhered to adhesive layer 28. In the embodiments wherein dies 120 include semiconductor substrates 121, the bottom surfaces 21*b* of semiconductor substrates 121 contact adhesive layer 28. Carrier 30 may include alignment marks (not shown), so that dies 120 and 220 are accurately mounted on desirable positions of carrier 30.

FIG. 4 also illustrates the placement of dies 220 on adhesive layer 28, wherein dies 220 may be identical to each other. In accordance with some embodiments, dies 220 are device dies, which may include active devices such as transistors 223 at the surfaces of the respective semiconductor substrates 221. In some embodiments, conductive pads 222 are formed on the top surfaces of dies 220. Conductive pads 222 may comprise gold, aluminum, copper, nickel, or combinations thereof. Dies 220 may have a structure different from that of dies 120, wherein the difference in the structure may include the difference in the circuits formed therein, the difference in the top-view sizes, the difference in the heights, and the like. In some embodiments, dies 220 may be formed from a wafer that has a different size than wafer 100 (FIG. 1). Spaces 31 are left between neighboring dies 120 and 220. When viewed from top, spaces 31 may form a grid that encircles each of dies 120 and 220.

Figure 5:
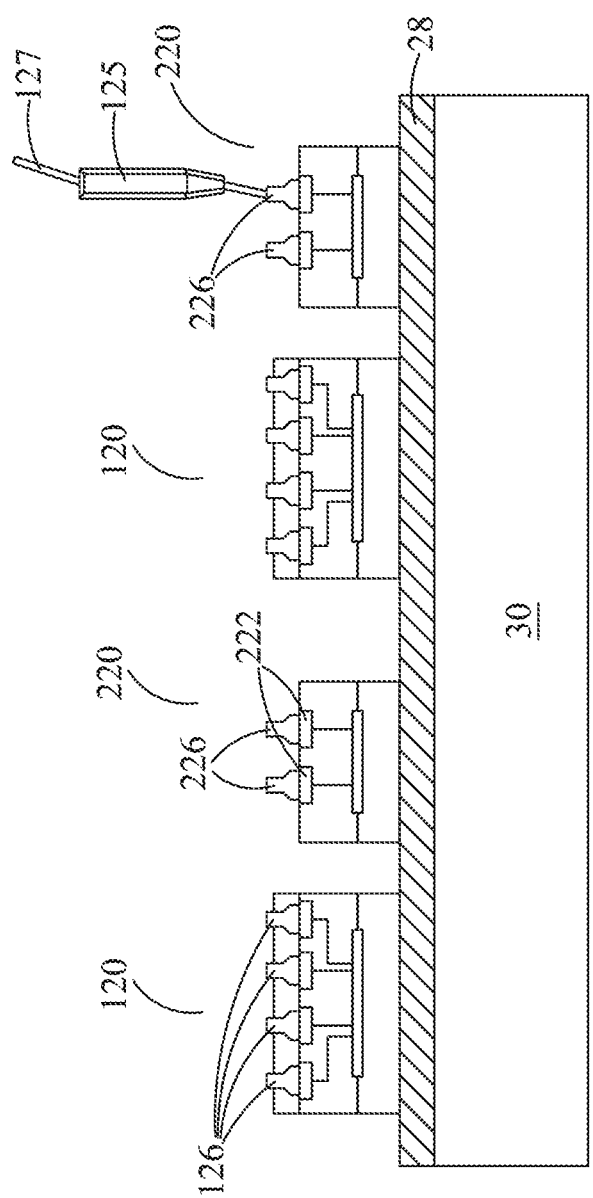
Figure 6:
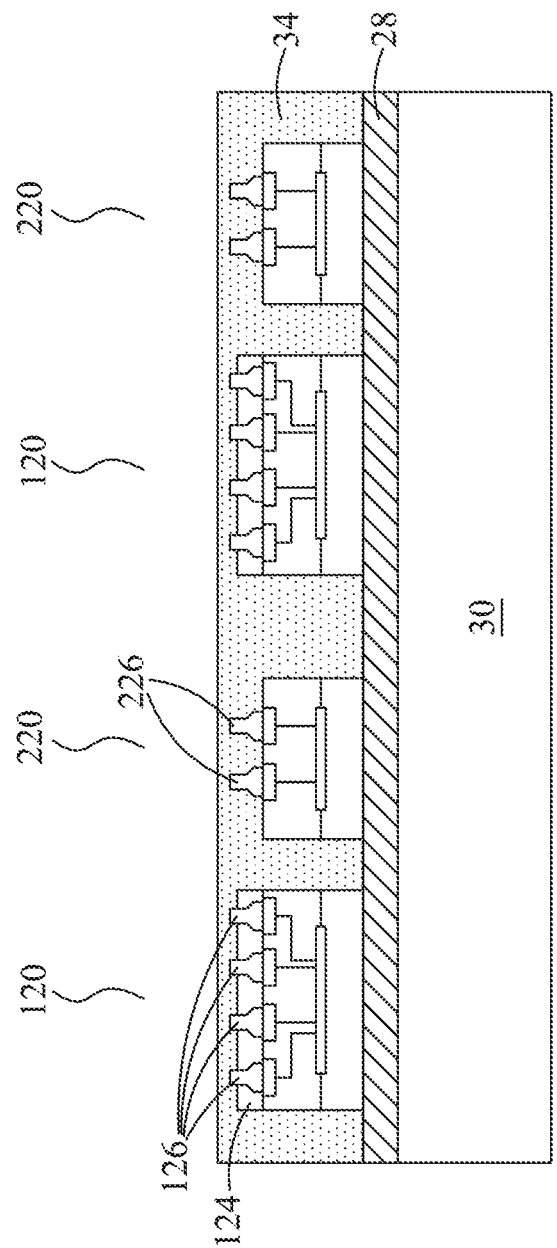

In accordance with some embodiments, dies 220 are placed on adhesive layer 28, with conductive pads 222 exposed at their top surfaces. Referring to FIG. 5, stud bumps 226 are formed on conductive pads 222. Stud bumps 226 may be formed of copper, gold, or the like. Similar to stud bumps 126, stud bumps 226 may be formed using a wire bonding method, wherein bond head 125 is used to bond wire 127 to form stud bumps 226. The resulting stud bumps 226 may be similar to stud bumps 126. After the formation of stud bumps 226, as shown in FIG. 6, polymer 34 is filled into the spaces between dies 120 and 220. In some exemplary embodiments, polymer 34 is a molding compound, and hence is referred to as molding compound 34 hereinafter, although it may be a material other than molding compound. For example, polymer 34 may be formed of other dielectric materials such as a molding underfill, an epoxy, or the like. Polymer 34 and dielectric layer 124 may be formed of a same material or different materials. The top surfaces of stud bumps 126 and 226 are also covered by molding compound 34. A curing process is then performed to solidify molding compound 34.

Figure 7:
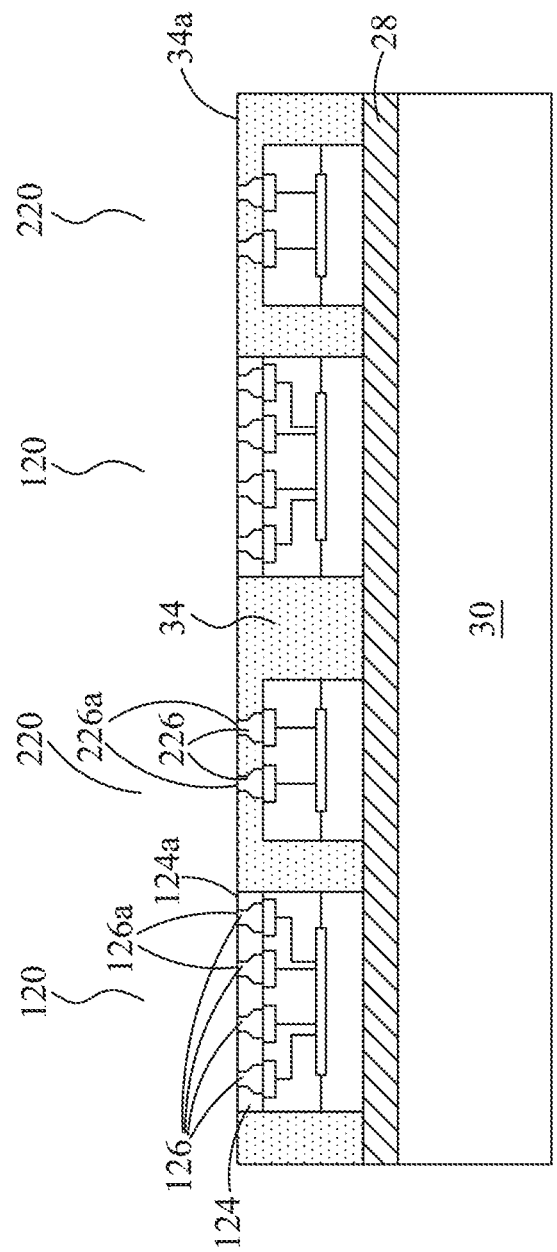

Referring to FIG. 7, a planarization such as a grinding step is performed on molding compound 34, until stud bumps 126 and 226, and possibly dielectric layer 124 in dies 120, are exposed. Accordingly, top surface 124*a* of dielectric layer 124, top surfaces 126*a* of stud bumps 126, top surfaces 226*a* of stud bumps 226, and top surface 34*a* of molding compound 34 may be substantially level with each other, and may be substantially flat. In the embodiments wherein stud bumps 126 are embedded in dielectric layer 124, a top surface layer of dielectric layer 124 may also be grinded, until stud bumps 126 are exposed. As a result of the grinding step, portions of molding compound 34, which portions are over stud bumps 126 and 226, are removed. When viewed from top, each of dies 120 and 220 and stud bumps 226 is surrounded by, and in contact with, molding compound 34. On the other hand, stud bumps 126 are surrounded by, and in contact with, dielectric layer 124, which is further surrounded by, and contacting, molding compound 34.

Figure 8:
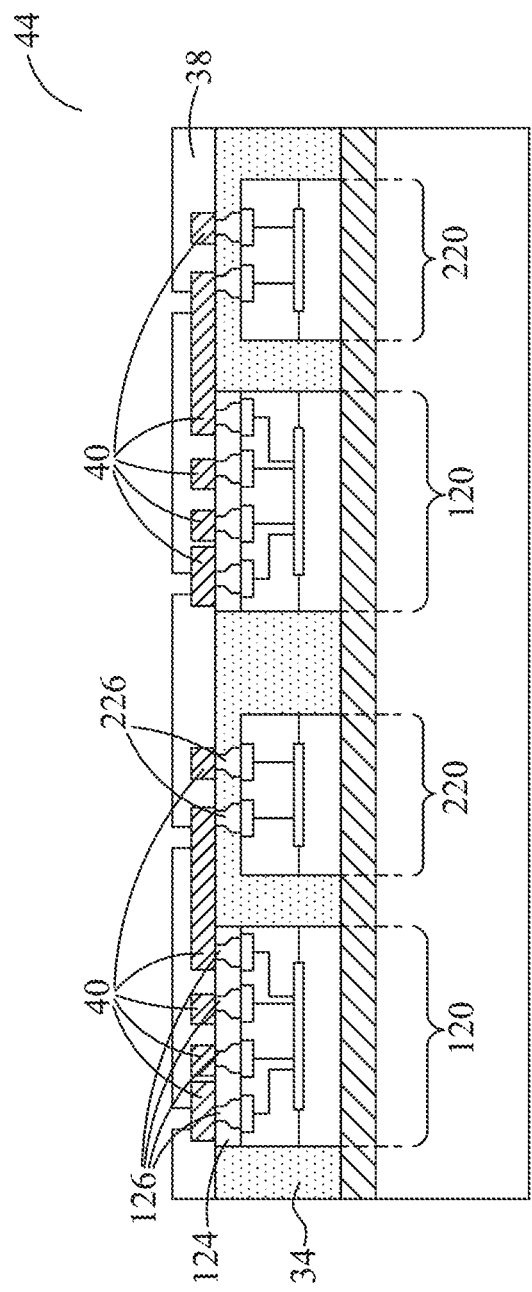

Next, as shown in FIG. 8, redistribution lines (RDLs) 40 are formed over dies 120 and 220, and are connected to stud bumps 126 and 226. In some embodiments, RDLs 40 have flat top surfaces and a substantially uniform thickness. RDLs 40 may be formed using, for example, a deposition method such as Physical Vapor Deposition (PVD), and possibly an etching step for patterning. Alternatively, the formation methods of RDLs 40 include damascene processes. RDLs 40 may be formed in dielectric layer(s) 38, and may include metal lines and vias. In some embodiments, RDLs 40 extend beyond edges of the respective dies 120 and 220 and overlapping the portions of molding compound 34 that are filled between dies 120 and 220. Accordingly, the resulting package is a fan-out package. During the formation of RDLs 40, the alignment marks (not shown) in dies 120 may be used for alignment purpose since dielectric layer 124 may be transparent. On the other hand, since dies 220 are covered by, for example, a molding compound, the alignment marks in dies 220 may not be seen through the opaque molding compound. Accordingly, the use of dies 120 (in which dielectric layer 124 is pre-formed) along with dies 220 provide alignment means for aligning the formation of RDLs 40. Wafer 44, which includes dies 120 and 220, molding compound 34, and RDLs 40, is thus formed.

Figure 9:
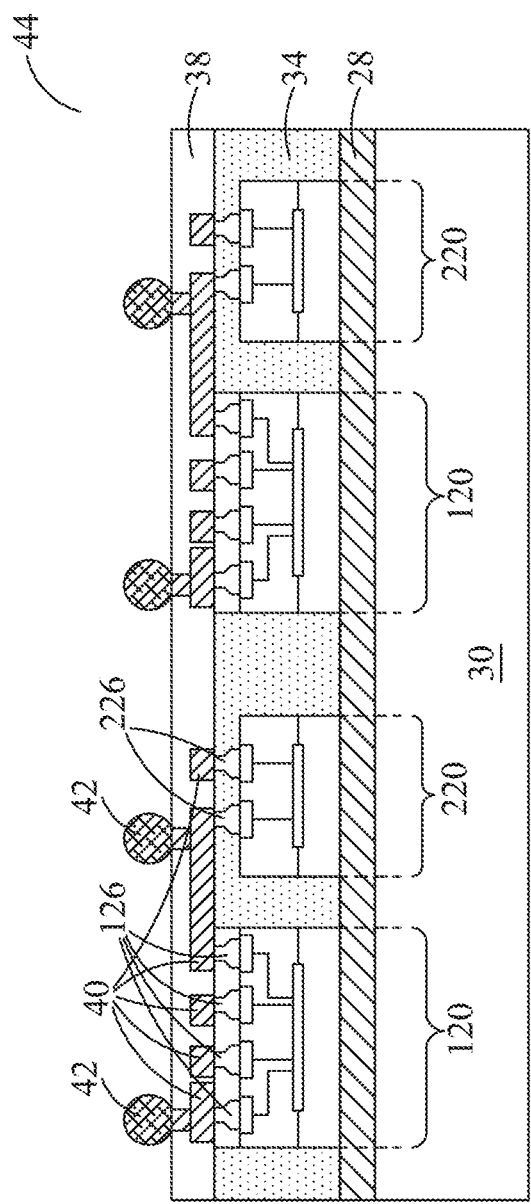

FIG. 9 illustrates the formation of electrical connectors 42, which are electrically coupled to RDLs 40. As a result, electrical connectors 42 are located on the top surface of the newly formed wafer 44. Electrical connectors 42 may be solder balls that are transferred onto wafer 44 using a ball-mounting head (not shown). Alternatively, electrical connectors 42 are non-reflowable bumps such as copper bumps or copper pillars. Some of electrical connectors 42 may be formed over and aligned to dies 120 and 220, while some other electrical connectors 42 may also be formed over and aligned to molding compound 34, and aligned to the spaces between dies 120 and 220.

Figure 10:
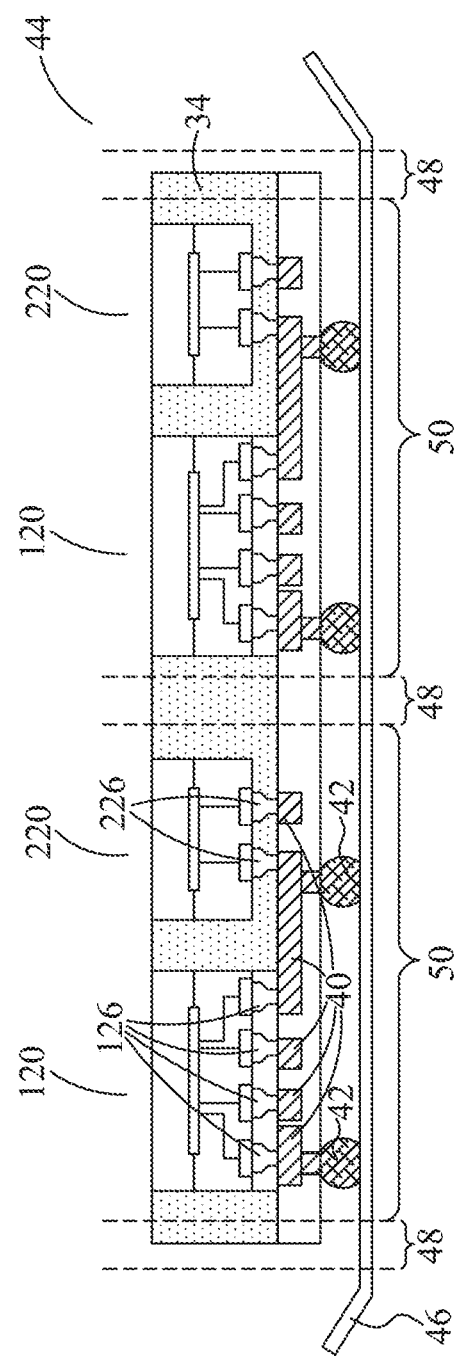

Next, as shown in FIG. 10, carrier 30 is demounted from wafer 44, and adhesive layer 28 may also be removed, leaving wafer 44. Wafer 44 may then be attached onto tape 46, and sawed apart along scribe lines 48. Accordingly, packages 50 are formed.

Figure 11:
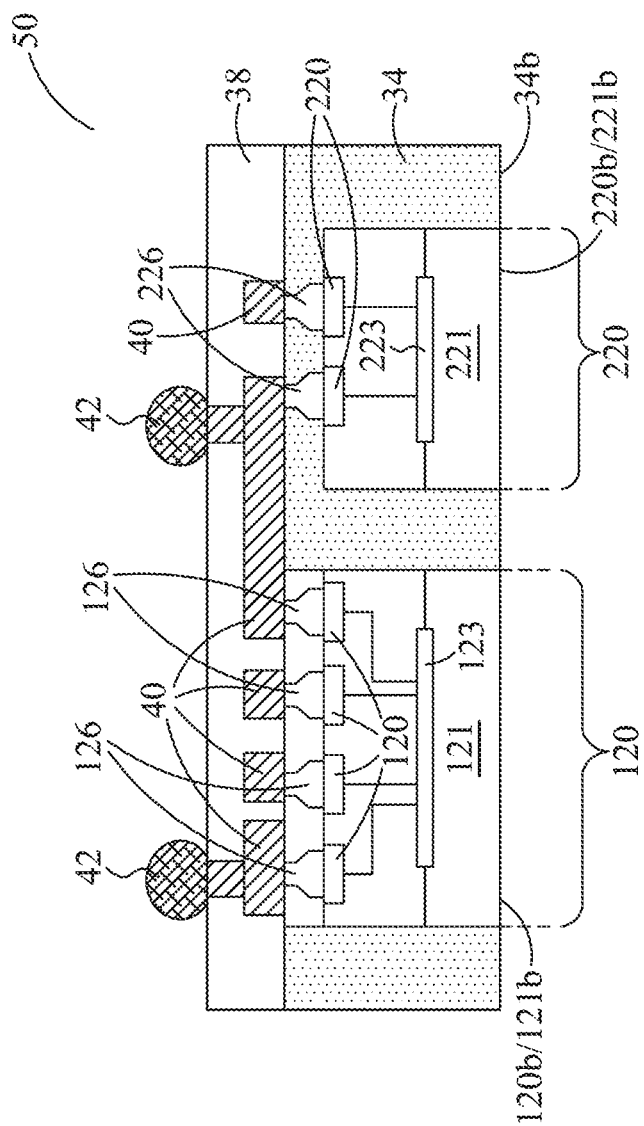

FIG. 11 illustrates one of exemplary packages 50. It is appreciated that in each of packages 50, the bottom surface 120*b* of die 120 and bottom surface 220*b* of die 220 are substantially level with bottom surface 34*b* of molding compound 34. Furthermore, bottom surface 120*b* of die 120 may also be the bottom surface 121*b* of substrate 121, and bottom surface 220*b* of die 220 may also be the bottom surface 221*b* of substrate 221. Accordingly, the bottom surface 121*b* of substrate 121 and bottom surface 221*b* of substrate 221 are level with bottom surface 34*b* of molding compound 34. On the top side, RDLs 40 are formed over, and connected to, stud bumps 126 and 226. Furthermore, RDLs 40 may extend over the portion of molding compound 34 that fills the spaces between dies 120 and 220. Accordingly, package 50 is a fan out package. Furthermore, polymer 34 may encircle and in contact with each of bumps 226.

FIGS. 1 through 11 illustrate the formation of package 50, which includes dies 120 and 220 that are different from each other. In alternative embodiments, in the step shown in FIG. 4, a plurality of dies that are similar to dies 120 are placed on adhesive 28 (FIG. 4). Each of the plurality of dies includes the pre-formed stud bumps (similar to stud bumps 126) and the pre-formed dielectric layer (similar to dielectric layer 124). However, the plurality of dies may include two or more types of dies having different structures. The dies similar to dies 220 and do not include pre-formed stud bumps, however, are not placed on adhesive 28. The resulting package is similar to package 50 shown in FIG. 11, except that die 220 in FIG. 11 is also replaced by a die that has the pre-formed stud bumps and a respective dielectric layer.

In alternative embodiments, all dies placed on adhesive 28 (FIG. 4) do not include pre-formed stud bumps. The resulting package is similar to what is shown in FIG. 11, except that die 120 in FIG. 11 is replaced by a die that does not have the pre-formed stud bumps and the respective dielectric layer.

In the embodiments, by forming stud bumps and redistribution layers over the stud bumps, dies that are not suitable for forming metal pillars may be packaged. The cost for the packaging is reduced, and the process time is shortened. The embodiments may be easily applied on the dies having different wafer sizes, and hence the production tools for forming the copper pillars on legacy wafers, such as 4-inch wafers, are not needed.

In accordance with embodiments, a package includes a die having a conductive pad at a top surface of the die, a stud bump over and connected to the conductive pad, and a redistribution line over and connected to the stud bump. An electrical connector is over and electrically coupled to the redistribution line.

In accordance with other embodiments, a device includes a die that further includes a semiconductor substrate, and a conductive pad at a top surface of the die. A stud bump is disposed over and connected to the conductive pad. A polymer encircles the die and contacts the sidewalls of the die. A bottom surface of the polymer is substantially level with a bottom surface of the semiconductor substrate. A top surface of the polymer is substantially level with a top surface of the stud bump. A redistribution line is over and connected to the stud bump.

In accordance with yet other embodiments, a method includes placing a die over a carrier. The die includes a substrate, a conductive pad over the substrate, and a stud bump over and electrically connected to the conductive pad. A polymer is applied to cover the die, wherein the polymer surrounds the die. A portion of the polymer overlapping the die is removed to expose the stud bump. A redistribution line is formed over the stud bump, wherein the redistribution line is electrically coupled to the conductive pad through the stud bump.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   placing a first device die over a carrier, the first device die comprising a surface conductive feature;
   after the first device die is placed on the carrier, forming a first stud bump on the first device die;
   forming a second stud bump on a second device die through wire bonding;
   sawing a wafer comprising the second device die and the second stud bump into discrete dies, wherein the discrete dies comprise the second device die;
   placing the second device die over the carrier;
   encapsulating the first device die and the second device die in an encapsulant;
   performing a planarization to planarize top surfaces of the encapsulant, the first stud bump, and the second bump; and
   forming redistribution lines over and electrically coupling to the first stud bump and the surface conductive feature.

2. The method of claim 1, wherein the forming the first stud bump comprises:
   performing a wire bonding on the first device die; and
   cutting a metal wire used for the wire bonding to leave the first stud bump on the first device die.

3. The method of claim 1 further comprising, before the sawing, forming a polymer layer to embed a lower portion of the second stud bump therein, wherein after the planarization, the polymer layer is exposed.

4. The method of claim 3, wherein at a time before the encapsulating and after the polymer layer is formed, a top portion of the second stud bump protrudes out of the polymer layer.

5. The method of claim 3, wherein at a time before the encapsulating and after the polymer layer is formed, an entirety of the second stud bump is in the polymer layer.

6. The method of claim 1, wherein the first stud bump comprises a bond ball and a bond wire attached to the bond ball, and in the planarization, a top portion of the bond wire of the first stud bump is removed.

7. The method of claim 1, further comprising forming solder regions over and electrically coupling to the redistribution lines.

8. A method comprising:
   forming a first device die comprising a first stud bump at a surface of the first device die;
   placing the first device die having the first stud bump over a carrier;
   placing a second device die over the carrier;
   when the second device die is on the carrier, performing a wire bonding to form a second stud bump on the second device die;
   encapsulating the first device die and the second device die in an encapsulant, wherein the encapsulant contacts sidewalls of a bond ball and a bond wire of the second stud bump; and
   forming a plurality of redistribution lines electrically coupling to the first stud bump and the second stud bump.

9. The method of claim 8 further comprising:
   before the placing the first device die, forming a dielectric layer to encircle and contact a sidewall of the first stud bump.

10. The method of claim 9, wherein the encapsulant is separated from the first stud bump by the dielectric layer, and the encapsulant comprises a portion overlapping a portion of the second device die and in physical contact with the second stud bump.

11. The method of claim 8 further comprising performing a planarization process, so that top surfaces of the first stud bump and the second stud bump are coplanar with a top surface of the encapsulant.

12. The method of claim 11, wherein in the planarization process, metal wires of the first stud bump and the second stud bump are polished.

13. The method of claim 8 further comprising planarizing the encapsulant, the first stud bump, and the second stud bump.

14. A method comprising:
   placing a first device die over a carrier, the first device die comprising:
      a first conductive pad; and
      a first stud bump over and electrically connecting to the first conductive pad, wherein the first stud bump comprises a bond stud contacting the first conductive pad, and a bond wire connected to the bond stud;
   placing a second device die over the carrier;
   after the second device die is placed, forming a second stud bump on a second conductive pad of the second device die;
   encapsulating the first device die and the second device die in an encapsulant; and
   forming a plurality of redistribution lines electrically coupling to the first stud bump and the second stud bump.

15. The method of claim 14 further comprising, before the first device die is placed, forming a polymer layer as a portion of the first device die, wherein the polymer layer is over the first conductive pad and embeds a portion of the first stud bump therein.

16. The method of claim 15, wherein the first conductive pad is covered by the polymer layer after the encapsulating, and the method further comprises planarizing the encapsulant, wherein the polymer layer is revealed after the planarizing.

17. The method of claim 14, wherein the forming the second stud bump comprises:
   performing a wire bonding on the second conductive pad when the second device die is over the carrier; and
   cutting a metal wire used for the wire bonding to leave the second stud bump on the second conductive pad.

18. The method of claim 14, wherein the encapsulant comprises a molding compound.

19. The method of claim 9 wherein the encapsulating the encapsulant comprises:
   dispensing the encapsulant so that the encapsulant covers the first device die and the second device die, and wherein the encapsulant is in physical contact with a top portion of a first sidewall of the first stud bump by the dielectric layer, and is separated from a bottom portion of the first sidewall of the first stud bump, and wherein the encapsulant physically contact an entirety of a sidewall of the second stud bump, with the second sidewall extending from a top to a bottom of the second stud bump; and
   curing the encapsulant.

20. The method of claim 9, wherein the dielectric layer comprises a polymer.

* * * * *